United States Patent
Castaneda et al.

(10) Patent No.: US 7,538,741 B2
(45) Date of Patent: *May 26, 2009

(54) IMPEDANCE MATCHED PASSIVE RADIO FREQUENCY TRANSMIT/RECEIVE SWITCH

(75) Inventors: Jesus Alfonso Castaneda, Los Angeles, CA (US); Ahmadreza (Reza) Rofougaran, Newport Coast, CA (US); Keith A. Carter, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/968,388

(22) Filed: Jan. 2, 2008

(65) Prior Publication Data

US 2008/0100526 A1 May 1, 2008

Related U.S. Application Data

(63) Continuation of application No. 11/700,696, filed on Jan. 30, 2007, now Pat. No. 7,369,096, which is a continuation-in-part of application No. 11/120,859, filed on May 3, 2005, now Pat. No. 7,170,465, which is a continuation of application No. 10/683,185, filed on Oct. 10, 2003, now Pat. No. 6,919,858.

(60) Provisional application No. 60/868,881, filed on Dec. 6, 2006.

(51) Int. Cl.
*H01Q 1/50* (2006.01)

(52) U.S. Cl. .................. 343/859; 343/749; 343/795; 343/822; 455/83; 455/333; 455/338

(58) Field of Classification Search .......... 343/749, 343/795, 822, 850, 859, 860; 455/83, 333, 455/338
See application file for complete search history.

(56) References Cited

U.S. PATENT DOCUMENTS

| 6,239,747 | B1 * | 5/2001 | Kaminski | 342/442 |
| 6,850,746 | B1 * | 2/2005 | Lloyd et al. | 455/272 |
| 7,283,793 | B1 * | 10/2007 | McKay | 455/83 |
| 7,369,096 | B2 * | 5/2008 | Castaneda et al. | 343/859 |

* cited by examiner

*Primary Examiner*—Douglas W. Owens
*Assistant Examiner*—Chuc Tran
(74) *Attorney, Agent, or Firm*—Garlick Harrison & Markison; Bruce E. Garlick

(57) ABSTRACT

A Radio Frequency (RF) structure services an antenna having a characteristic impedance and includes a differential Power Amplifier (PA), a differential Low Noise Amplifier (LNA), and a balun transformer. The differential PA has a differential PA output with a PA differential output impedance. The differential LNA has a differential LNA input with an LNA differential input impedance. The balun transformer has a singled ended winding coupled to the antenna, a differential winding having a first pair of tap connections coupled to the differential PA output and a second pair of tap connections coupled to the differential LNA input, and a turns ratio of the single ended winding and the differential winding. The turns ratio and the first pair of tap connections impedance match the PA differential output impedance to the characteristic impedance of the antenna. The turns ratio and the second pair of tap connections impedance match the LNA differential input impedance to the characteristic impedance of the antenna.

8 Claims, 7 Drawing Sheets antenna coupling structure 73 antenna coupling structure 73

US 7,538,741 B2

IMPEDANCE MATCHED PASSIVE RADIO FREQUENCY TRANSMIT/RECEIVE SWITCH

REFERENCES TO RELATED APPLICATIONS

This patent application is a continuation of U.S. patent application Ser. No. 11/700,696, filed Jan. 30, 2007, now issued as U.S. Pat. No. 7,369,096, which:

1. is a continuation in part of U.S. patent application Ser. No. 11/120,859, filed May 3, 2005 now U.S. Pat. No. 7,170,465, entitled "RF Antenna Coupling Structure", having a filing date of May 3, 2005 (BP2971C), which was a continuation of and with U.S. patent application Ser. No. 10/683,185, filed Oct. 10, 2003 now U.S. Pat. No. 6,919,858, entitled "RF Antenna Coupling Structure" (BP2971); and 2. claims priority to co-pending provisional application No. 60/868,881 filed on Dec. 6, 2006.

BACKGROUND OF THE INVENTION

1. Technical Field of the Invention

This invention relates generally to communication systems and, more particularly, to radio receivers and transmitters used within such communication systems.

2. Description of Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel or channels. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

To recapture data from RF signals, a receiver includes a low noise amplifier, down conversion module and demodulation module. To convert data into RF signals, a transmitter includes a power amplifier, an up-conversion module and a modulation module. For radio frequency integrated circuits (RFICs), it is desirable to provide the low noise amplifier and the power amplifier with differential RF signals, instead of single-ended RF signals, to improve noise performance and common mode rejection. To convert received single-ended RF signals into differential RF signals for a receiver, and to convert differential RF signals into single-ended signals for a transmitter, the receiver and/or the transmitter includes a balun (i.e., a balanced/unbalanced transformer).

Until very recently, the baluns were off-chip, i.e., on the printed circuit board, and were typically implemented in the form of micro-strip lines. However, for semiconductor chip designs, it is desirable to place RFIC baluns on-chip to reduce the cost of off-chip printed circuit board components. Recent attempts to integrate a balun onto a radio frequency integrated circuit have had limited success. For example, parallel winding, inter-wound winding, overlay winding, single planar, square wave winding, and concentrical spiral winding on-chip baluns have been tried with limited success. Each of these on-chip baluns suffers from one or more of: low quality factor, (which causes the balun to have a relatively large noise FIG. and large energy loss); too low of a coupling coefficient (which results in the inductance value of the balun not significantly dominating the parasitic capacitance making impedance matching more complex); asymmetrical geometry (which results in degradation of differential signals); and a relatively high impedance ground connection at the operating frequency.

Other problems exist for RFICs that include on-chip baluns. For example, a power amplifier (PA) and a low noise amplifier (LNA) have different balun requirements. An LNA balun should provide a high voltage gain with a low noise figure (NF), which is directly related to the quality factor (Q) of the balun. An LNA balun should also be inductive enough such that only on-chip capacitors are needed for impedance matching with the antenna and to provide the required voltage gain. A PA balun, however, is required to support large currents, which requires a large track width of the transformer windings. The PA balun quality factor (Q) should also be high to provide high efficiency and high PA linearity and should have enough current amplification to provide a large current swing at the antenna output. The PA balun should also be inductive enough such that only on-chip capacitors are needed for impedance matching with the antenna.

Therefore, a need exists for an integrated radio frequency (RF) integrated circuit that includes an antenna coupling structure that meets the differing operational requirements of both the LNA and the PA.

BRIEF SUMMARY OF THE INVENTION

The present invention sets forth a Radio Frequency (RF) structures and operations and design processes therefore sub-

DETAILED DESCRIPTION OF THE INVENTION

Figure 1:
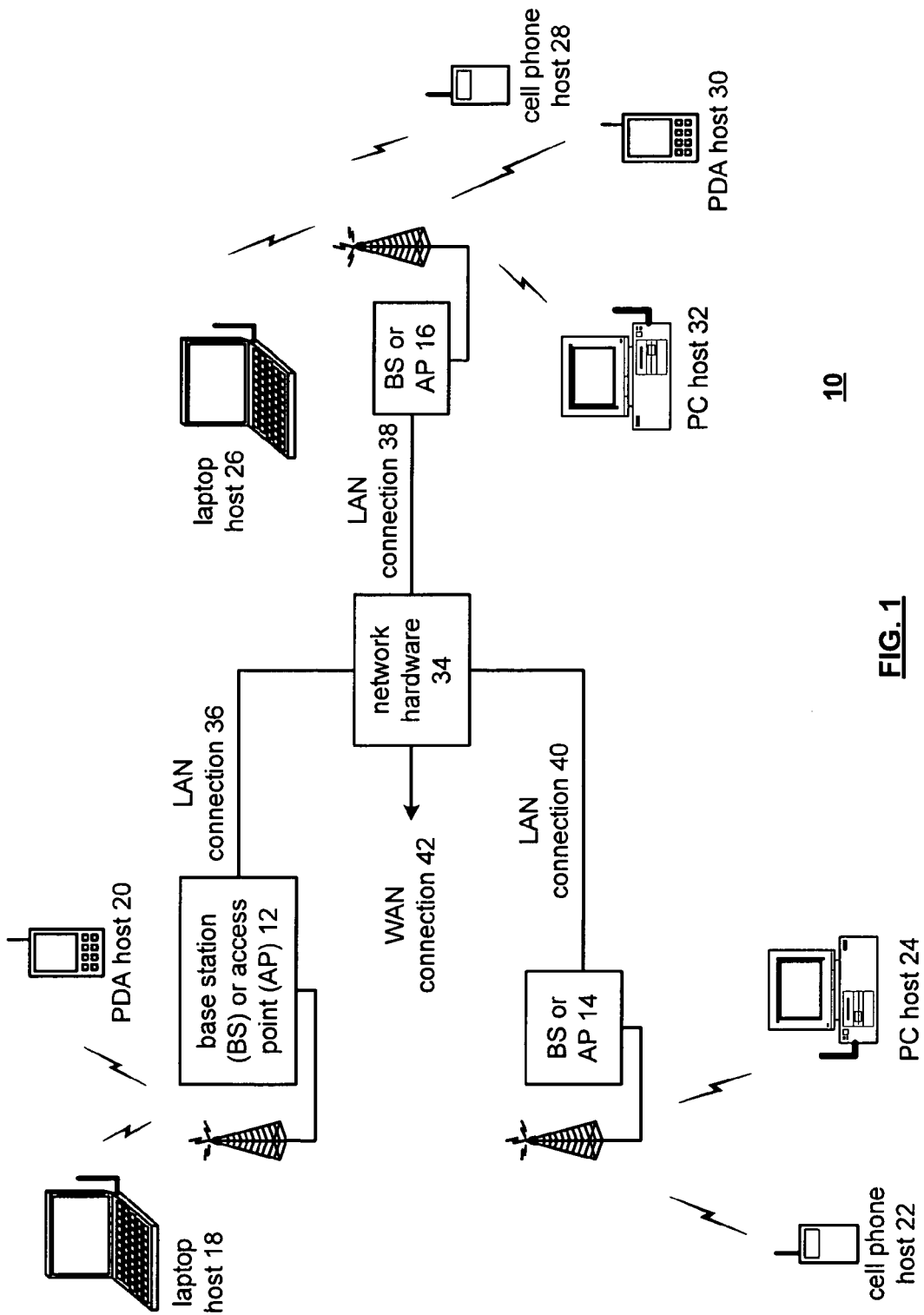
FIG. 1 is a schematic block diagram of a wireless communication system in accordance with the present invention.

FIG. 1 is a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2. Further, components of these wireless communication devices, their construct, and methodologies for design of such components will be described further herein with reference to FIGS. 3-8.

The base stations or access points 12 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes an integrated RF front-end architecture as disclosed herein to enhance performance of radio frequency integrated circuits.

Figure 2:
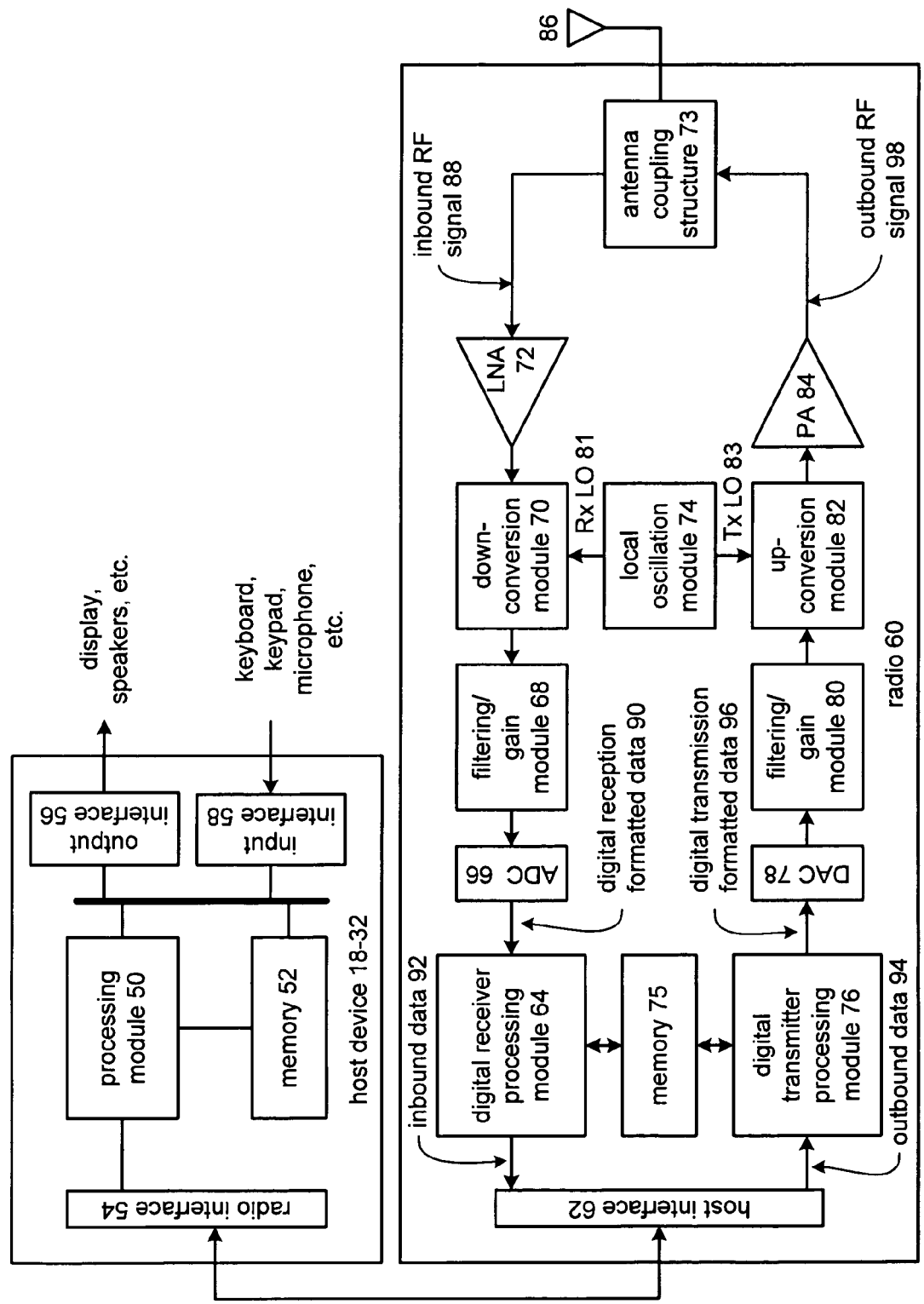
FIG. 2 is a schematic block diagram of a wireless communication device in accordance with the present invention.

FIG. 2 is a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides outbound data from the processing module 50 to the radio 60. The processing module 50 may receive the outbound data from an input device such as a keyboard, keypad, microphone, et cetera, via the input interface 58 or generate the data itself. For data received via the input interface 58, the processing module 50 may perform a corresponding host function on the data and/or route it to the radio 60 via the radio interface 54.

Radio 60 includes a host interface 62, a receiver section, a transmitter section, local oscillation module 74, an antenna coupling structure 73, and an antenna 86. The receiver section includes a digital receiver processing module 64, analog-to-digital converter 66, filtering/gain module 68, down conversion module 70, low noise amplifier (LNA) 72, and at least a portion of memory 75. The transmitter section includes a digital transmitter processing module 76, digital-to-analog converter 78, filtering/gain module 80, up-conversion module 82, power amplifier 84, and at least a portion of memory 75. The antenna 86 may be a single antenna that is shared by the transmit and receive paths via the antenna coupling structure 73 or multiple antennas to provide a diversity antenna arrangement. The antenna implementation will depend on the particular standard to which the wireless communication device is compliant. Constructs particularly relating to the LNA 72, the PA 84, and the antenna coupling structure and methodologies for design of such components will be described further herein with reference to FIGS. 3-8.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, IEEE 802.11g, Bluetooth, one or more cellular standards, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84 amplifies the RF signal to produce outbound RF signal 98 and routes the outbound RF signal 98 to the antenna 86 via the antenna coupling structure 73. The antenna 86 transmits the outbound RF signal 98 to a targeted device such as a base station, an access point and/or another wireless communication device.

The radio 60 also receives, via the antenna 86 and the antenna coupling structure 73, an inbound RF signal 88, which can be transmitted by a base station, an access point, or another wireless communication device. The antenna coupling structure 73 provides the inbound RF signal 88 to the LNA 72, which amplifies the signal 88 to produce an amplified inbound RF signal. The RF front-end 72 provides the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the radio may be implemented in a variety of ways to receive RF signals and to transmit RF signals and may be implemented using a single integrated circuit or multiple integrated circuits. Further, at least some of the modules of the radio 60 may be implemented on the same integrated circuit with at least some of the modules of the host device 18-32. Regardless of how the radio is implemented, the concepts of the present invention are applicable.

Figure 3:
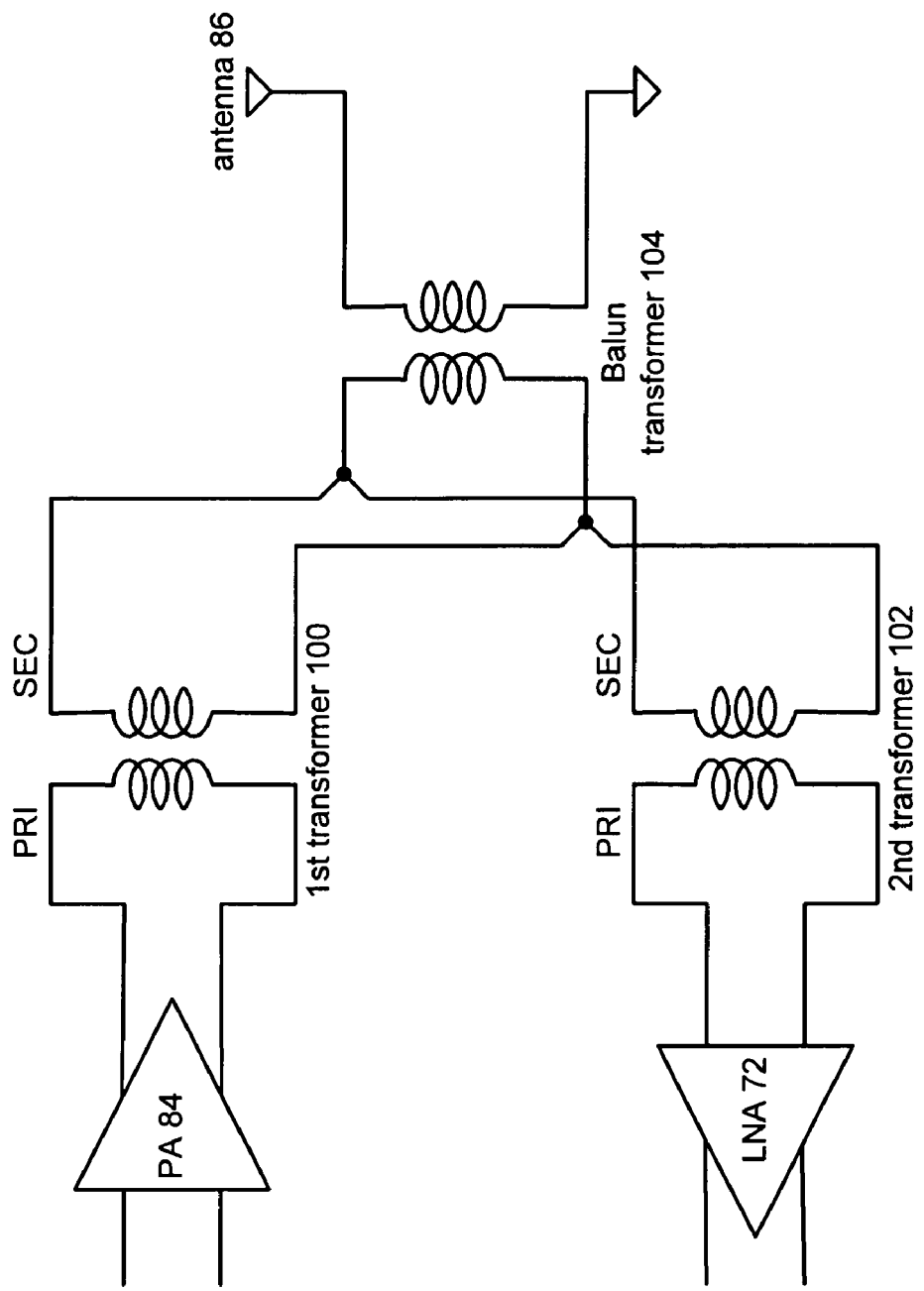
FIG. 3 is a schematic block diagram of an antenna coupling structure in accordance with the present invention.

FIG. 3 is a schematic block diagram of an antenna coupling structure 73 operably coupled to a power amplifier 84, a low noise amplifier 72, and an antenna 86. The antenna coupling structure 73 includes a balun transformer 104, a first transformer 100, and a second transformer 102. The balun transformer 104 may be constructed in accordance with the teachings of co-pending patent application entitled ON-CHIP BALUN TRANSFORMER, having a filing date of Jan. 23, 2002, and a Ser. No. 10/055,425, which is incorporated herein by reference and may further have a one-to-one turns ratio. The balun transformer 104 has a single-ended winding that couples to the antenna 86 and to ground and a differential winding that couple to the second windings of both the first and second transformers 100 and 102.

As is further shown, the primary winding of the first transformer 100 is coupled to the differential output of the power amplifier 84. The first transformer 100 includes a large track width of the transformer windings to support the large currents of the power amplifier 84. In additions, the first transformer 100 has a high quality factor (Q) (e.g., greater than 10) to provide a highly efficiency and highly linear coupling to the power amplifier 84. Further, the first transformer 100 includes a gain (e.g., two or more) to amplify the output current of the power amplifier 84 to provide a large current swing at the antenna output. Still further, the primary winding of the first transformer 100 has a desired impedance of, for example 200 Ohms, to substantially match the output load impedance of the power amplifier 84. The secondary winding of the first transformer 100 has a desired impedance of, for example 50 Ohms, to substantially match the impedance requirements of the antenna 86.

As is also shown, the primary winding of the second transformer 102 is coupled to the differential input of the low noise amplifier 72. The second transformer 102 has a high voltage gain with a low noise figure (NF). The primary winding of the second transformer 100 has a desired impedance of, for example 1000 Ohms, to substantially match the input impedance requirements of the low noise amplifier 72. The secondary winding of the second transformer 102 has a desired impedance of, for example 50 Ohms, to substantially match the impedance requirements of the antenna 86.

In operation, the radio 60 is either transmitting or receiving RF signals. Accordingly, the power amplifier 84 and the low noise amplifier 72 each include an enable circuit, where, when the radio 60 is transmitting RF signals, the power amplifier 84 is on and the low noise amplifier 72 is off and, when the radio is receiving RF signals, the power amplifier 84 is off and the low noise amplifier 72 is on. Thus, when RF signals are being transmitted, the power amplifier 84 provides differential signals to the $1^{st}$ transformer 100, which adjusts the impedance and current level of the differential signals and provides the adjusted differential signals to the balun transformer 104. The balun transformer 104 converts the differential signals into single-ended signals that are radiated by the antenna 86.

When RF signals are received, the balun transformer 104 converts the single-ended RF signals into differential signals. The second transformer 102 receives the differential signals and adjusts them and provides the adjusted RF differential signals to the low noise amplifier 102. With such an antenna structure, an integrated radio frequency (RF) integrated circuit that includes a symmetrical balun antenna coupling structure that meets the differing operational requirements of both the LNA and the PA is achieved.

Figure 4:
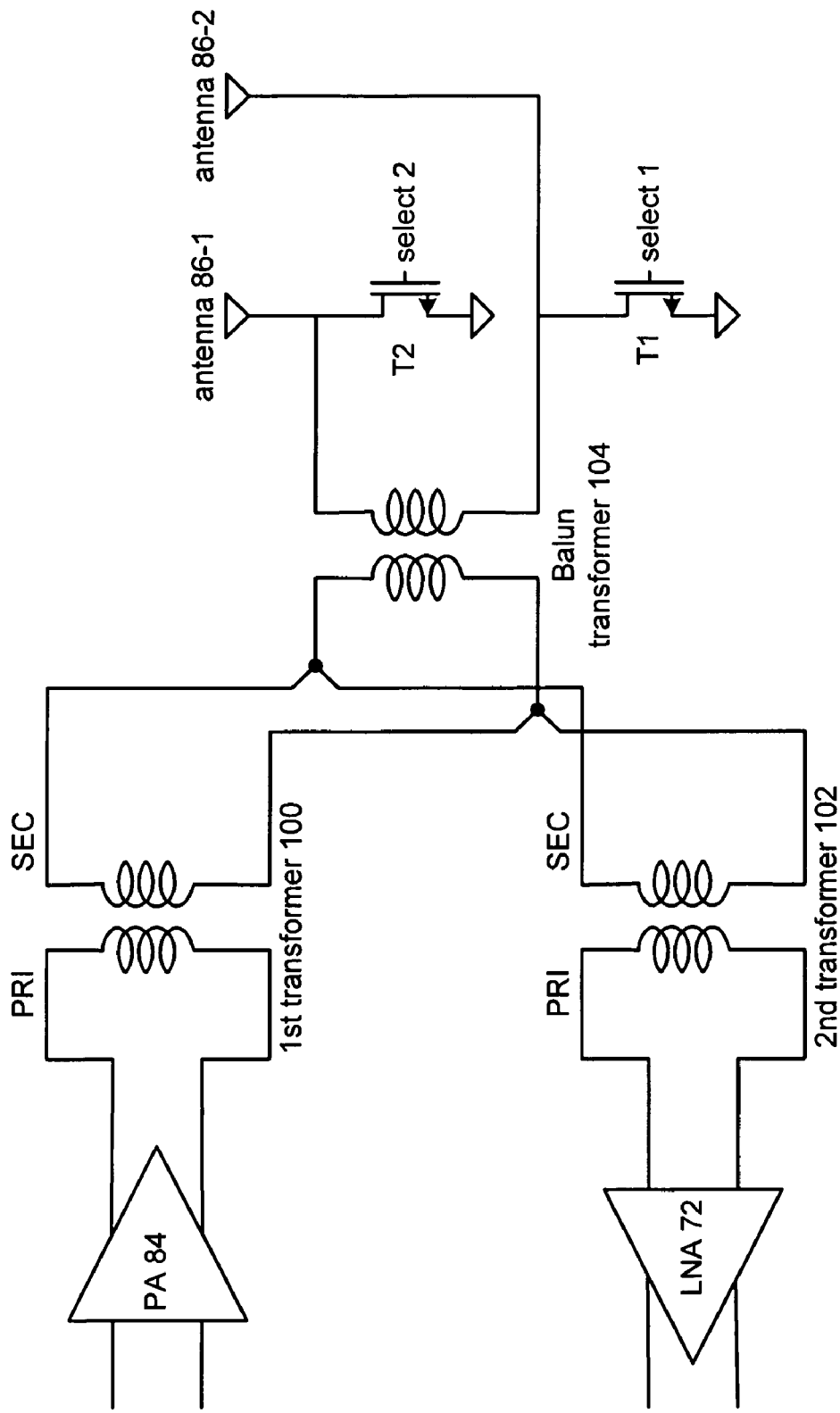
FIG. 4 is a schematic block diagram of another antenna coupling structure in accordance with the present invention.

FIG. 4 is a schematic block diagram of another antenna coupling structure 73 that includes the first transformer 100, the second transformer 102, the balun transformer 104, two antennas 86-1 and 86-2, and a pair of switches. The functionality of the first, second, and balun transformers 100-104 is as previously discussed with reference to FIG. 3. This embodiment of the antenna coupling structure 73 accommodates a diversity antenna arrangement. As is known, a diversity antenna arrangement includes two or more antennas that are physically spaced by a distance corresponding to a quarter wavelength, a half wavelength, and/or a full wavelength of the RF signals. Based on received signal strength, one of the antennas is selected.

To provide the selection of one of the antennas, the transistors are enabled and disabled. For example, if antenna 86-1 is to be used, select 1 signal is a logic high and select 2 signal is a logic low such that transistor T2 is disabled and transistor T1 is enabled. If, however, antenna 86-2 is to be used, select 1 signal is a logic low and select 2 signal is a logic high, thus enabling transistor T2 and disabling transistor T1.

Figure 5:
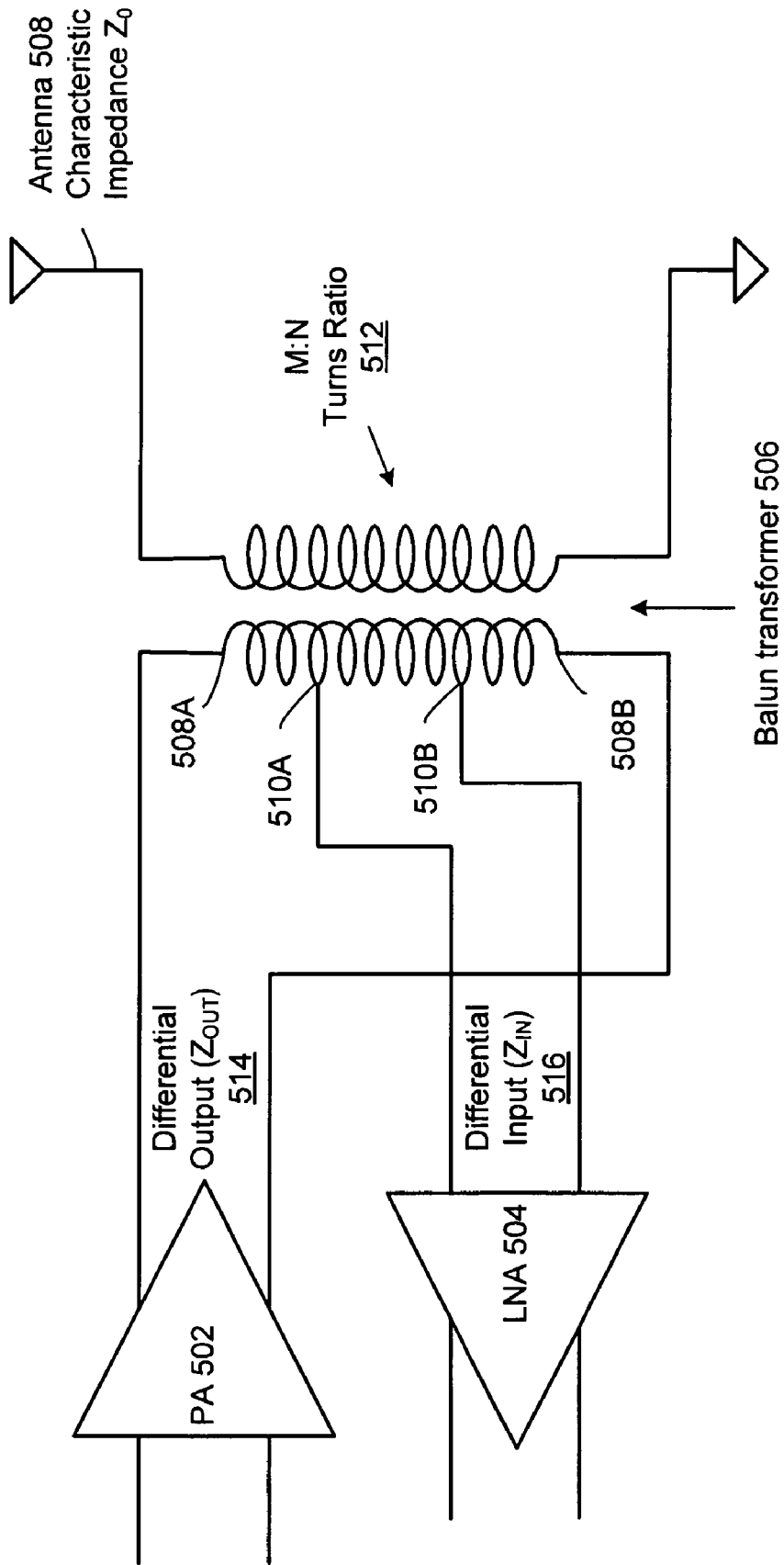
FIG. 5 is a schematic block diagram of another antenna coupling structure in accordance with the present invention.

FIG. 5 is a schematic block diagram of another antenna coupling structure in accordance with the present invention. As contrasted to the structures illustrated in FIGS. 3 and 4, the structure of FIG. 5 supports the direct connection of the PA 502 and LNA 504 to differential windings of a balun transformer 506. The RF structure of FIG. 5 includes an antenna 508 having a characteristic impedance ($Z_0$), a differential PA 502, a differential LNA 504, and a balun transformer 506.

The differential PA 502 has a differential PA output 514 with a PA differential output impedance $Z_{OUT}$. In one contemplated construct, the PA 502 operates with a low supply voltage, supplies a relatively large power, and has a relatively low output impedance $Z_{OUT}$. With the PA 502 providing a relatively large power, the differential output 514 produces a large average (DC) current. These requirements for the PA 502 affect the design and construct of not only the PA 502 but the balun transformer 506 as well. The differential LNA 504 has a differential LNA input 516 with an LNA differential input impedance $Z_{IN}$.

The balun transformer 506 includes a singled ended winding that couples to the antenna 508. In the illustrated embodiment, the single ended winding has a first tap connection coupled to the antenna 508 and a second tap connection coupled to a reference ground. The balun transformer 506 also includes a differential winding having a first pair of tap connections 508A and 508B that couple to the differential PA output 514 and a second pair of tap connections 510A and 510B that couple to the differential LNA input 516. The balun transformer 506 has a turns ratio 512 (M:N) of the single ended winding and the differential winding. Further, the balun transformer 506 conductors are sufficient to support the relatively high average DC current output of the PA 502.

According to an aspect of the present invention, the turns ratio 512 (M:N) and the first pair of tap connections 508A and 508B are selected to impedance match the PA differential output impedance $Z_{OUT}$ to the characteristic impedance $Z_0$ of the antenna. In the illustrated embodiment the first pair of tap connections 508A and 508B extends across all windings of differential windings of the balun transformer 506. However, in other embodiments, the first pair of tap connections 508A and 508B may extend across less than all of the N turns of the balun transformer 506. According to the present invention, the LNA is designed such that its LNA differential input impedance $Z_{IN}$ is relatively low so that impedance matching with the antenna 508 is possible. With the LNA differential impedance $Z_{IN}$ within a range that allows for impedance matching, the turns ratio 512 (M:N) and the second pair of tap connections 510A and 510B are selected so that they impedance match the LNA differential input impedance 516 $Z_{IN}$ to the characteristic impedance $Z_0$ of the antenna 508. Note that the turns ratio 512 (M:N) is selected so that not only is impedance matching for the PA 502 possible but also so that impedance matching for the LNA 504 is possible.

The first pair of tap connections 508A and 508B have a first effective turns ratio with the single ended winding of the balun transformer 506, the second pair of tap connections 510A and 510B have a second effective turns ratio with the single ended winding, and the first effective turns ratio differs from the second effective turns ratio. With one particular embodiment of this construct, the LNA differential input impedance $Z_{IN}$ is approximately 60 ohms, the PA differential output impedance $Z_{OUT}$ is approximately 20 ohms, and the characteristic impedance $Z_0$ of the antenna is approximately 50 ohms. With this construct, the turns ratio and first pair of tap connections 508A and 508B are selected so that the first effective turns ratio impedance matches the 20 ohm PA differential output impedance $Z_{OUT}$ to the 50 ohm characteristic impedance $Z_0$ of the antenna 508. Further, with this construct, the turns ratio and second pair of tap connections 510A and 510B are selected so that the second effective turns ratio impedance matches the 60 ohm LNA differential input impedance $Z_{IN}$ to the 50 ohm characteristic impedance $Z_0$ of the antenna 508.

In order to satisfy the relatively low LNA differential input impedance $Z_{IN}$ requirements of the LNA 504, particular LNA input constructs are employed. Examples of these constructs include common-gate topology constructions and cross-coupled topology constructions. These structures are generally known in the art and will be considered only briefly herein. The transconductance stage of a cross-coupled topology construction will be described with reference to FIG. 6.

According to another aspect of the present invention, the differential PA 502 has both a turned-on PA differential output impedance and a turned-off PA differential output impedance. Further, the differential LNA 506 has both a differential LNA input with a turned-on LNA differential input impedance and a turned-off LNA differential input impedance. With this aspect, the turned-on PA differential output impedance is less than the turned-on PA differential input impedance and the turned-on LNA differential output impedance is less than the turned-on LNA differential input impedance. Further, the turned-on PA differential output impedance may be less than the turned-on LNA differential input impedance. According to this aspect of the present invention, the turns ratio and the first pair of tap connections 508A and 508B impedance match the turned-on PA differential output impedance to the characteristic impedance of the antenna. Further, the turns ratio and the second pair of tap connections 510A and 510B impedance match the turned-on LNA differential input impedance to the characteristic impedance of the antenna.

Figure 6:
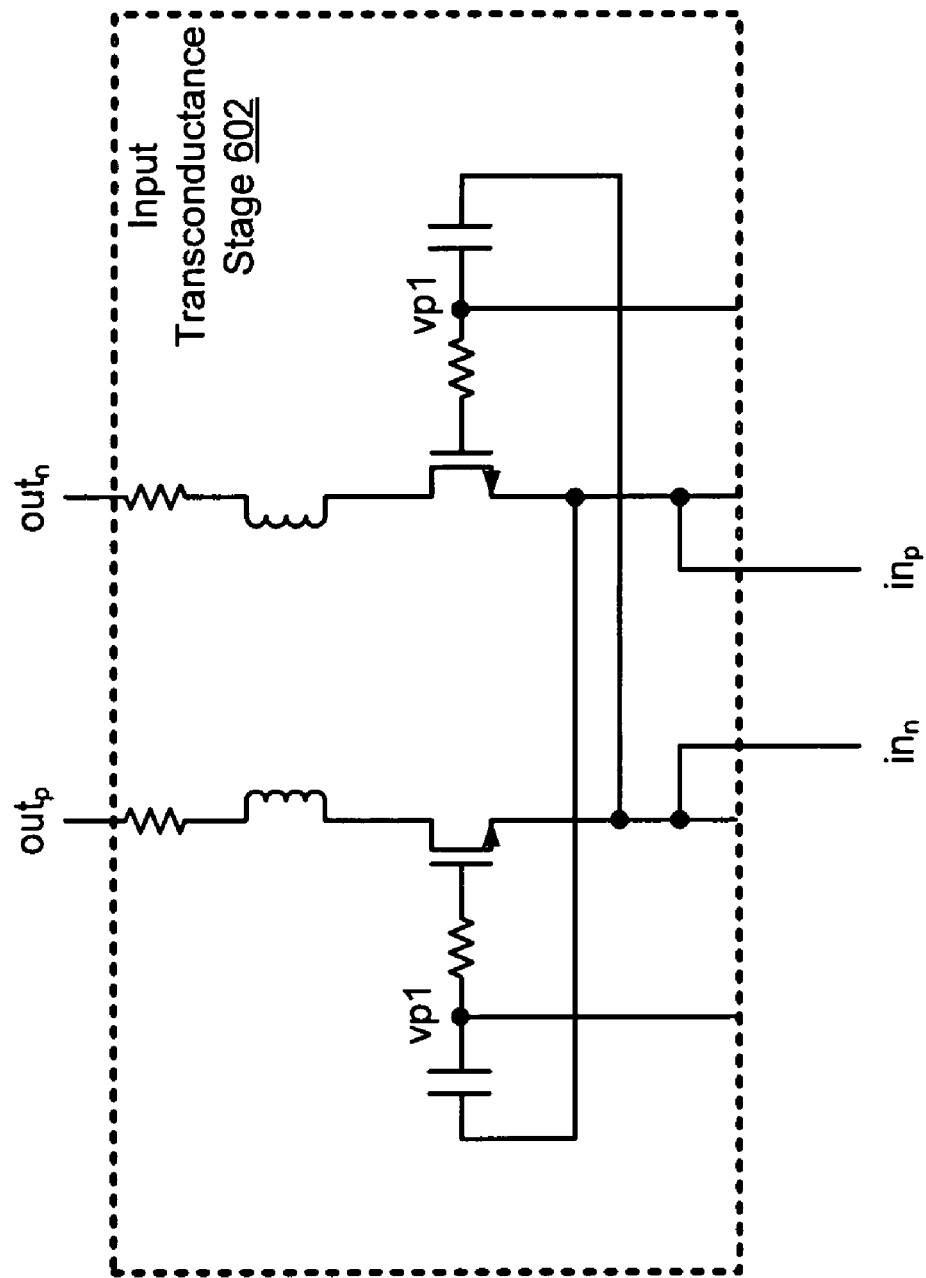
FIG. 6 is a schematic block diagram illustrating a cross-coupled input transconductance stage of a Low Noise Amplifier constructed according to an embodiment of the present invention.

FIG. 6 is a schematic block diagram illustrating a cross-coupled input transconductance stage of a Low Noise Amplifier constructed according to an embodiment of the present invention. The input transconductance state 602 resides at an input of the LNA 516 of FIG. 5, for example. The input transconductance stage 602 is the primary component of the differential LNA input impedance $Z_{IN}$ that is impedance matched to the antenna 508 characteristic impedance $Z_0$. Thus, the impedance transconductance stage 602 provides a relatively low input impedance (compared to other topology constructs) to enable such impedance matching.

Figure 7:
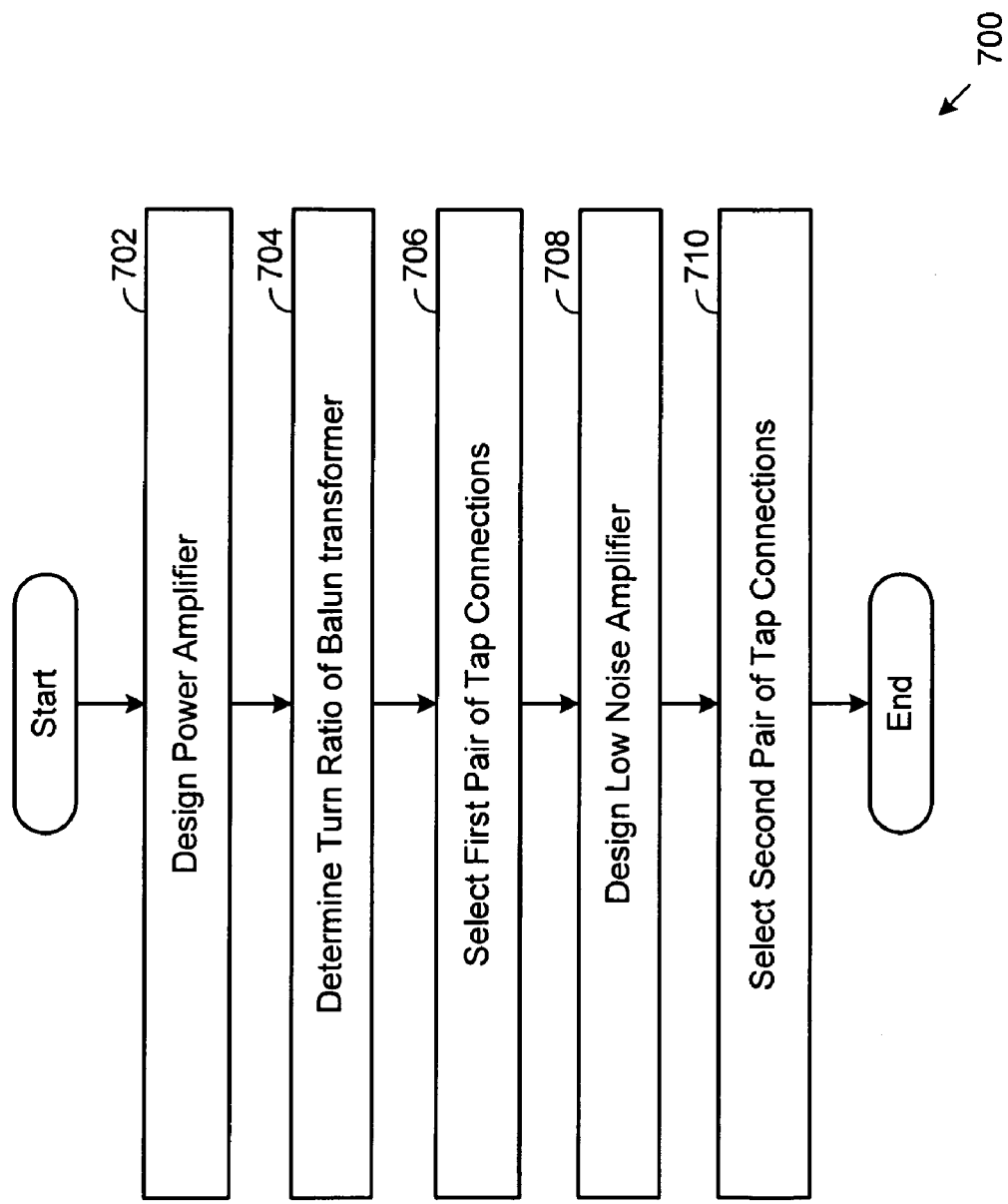
FIG. 7 is a flow chart illustrating a design process employed in the design of an antenna coupling structure and related components in accordance with the present invention.

FIG. 7 is a flow chart illustrating a design process employed in the design of an antenna coupling structure and related components in accordance with the present invention. The design process 700 includes a method for designing a Radio Frequency (RF) structure having a differential Power Amplifier (PA) with a PA differential output impedance, a differential Low Noise Amplifier (LNA) with a LNA differential input impedance, a balun transformer having a single ended winding and a differential winding, and an antenna having a characteristic impedance. The design process 700 begins with a first operation (step 702) of selecting a topology and structure of the differential PA. As was previously described above, the differential PA must supply high output power and operate with a relatively low supply voltage. An example of such a differential PA is a differential PA constructed in an Integrated Circuit that is integrated with other components of a RF transceiver as are illustrated herein in FIG. 2 on a single Integrated Circuit or multiple Integrated Circuits.

Operation 700 continues with determining a turns ratio of the single ended winding and the differential winding of the balun transformer (step 704). Generally, the turns ratio is selected to permit impedance matching between the PA differential output impedance and the characteristic impedance of the antenna. Operation continues with the selection of a first pair of tap connections of the balun transformer to impedance match the PA differential output impedance of the differential PA to the characteristic impedance of the antenna (step 706). In some embodiments, the first pair of tap connections extends fully across the differential winding of the balun transformer.

Operation 700 progresses with selecting a topology and structure of the differential LNA amplifier to cause the LNA differential input impedance to roughly impedance match the characteristic impedance of the antenna when transformed by the turns ratio of the single ended winding and the differential winding (step 708). Finally, operation 700 concludes with determining a second pair of tap connections of the differential winding of the balun transformer to impedance match the LNA differential input impedance the characteristic impedance of the antenna (step 710). The reader should note that the operations 700 of FIG. 7 are consistent with the structures and operations previously described herein.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

As one of ordinary skill in the art will appreciate, the terms "operably coupled" and "communicatively coupled," as may be used herein, include direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled" and "communicatively coupled."

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the present invention, as limited only by the scope of the appended claims.

What is claimed is:

1. A balun transformer for servicing an antenna having a characteristic impedance, a differential Power Amplifier (PA) having a differential PA output impedance, and a differential Low Noise Amplifier (LNA) having a differential LNA input impedance, the balun transformer comprising:
   a singled ended winding having an antenna connection; and
   a differential winding having:
      a pair of PA tap connections; and
      a pair of LNA tap connections; and
   a turns ratio of the single ended winding and the differential winding, wherein:

the turns ratio and the pair of PA tap connections impedance match the differential PA output impedance to the characteristic impedance of the antenna; and the turns ratio and the pair of LNA tap connections impedance match the differential LNA input impedance to the characteristic impedance of the antenna.

2. The balun transformer of claim 1, wherein:

the pair of PA tap connections has a first effective turns ratio with the single ended winding;

the pair of LNA tap connections have a second effective turns ratio with the single ended winding; and the first effective turns ratio differs from the second effective turns ratio.

3. The balun transformer of claim 2, wherein the differential PA output impedance is less than the differential LNA input impedance.

4. The balun transformer of claim 1, wherein the LNA comprises a common-gate topology construction.

5. The balun transformer of claim 1, wherein the LNA comprises a cross-coupled topology construction.

6. The balun transformer of claim 1, wherein the single ended winding comprises:

an antenna tap connection; and a ground tap connection.

7. The balun transformer of claim 1, wherein:

the differential PA output impedance is a turned-on impedance; and the differential LNA output impedance is a turned-on impedance.

8. The balun transformer of claim 1, wherein:

the differential PA output impedance is greater than a turned-off PA differential output impedance of the PA; and the differential LNA output impedance is greater than a turned-off LNA differential output impedance of the PA.

* * * * *